United States Patent
Rhee (10) Patent No.: US 9,711,692 B2
(45) Date of Patent: Jul. 18, 2017

(54) DISPLAY DEVICE USING SEMICONDUCTOR LIGHT EMITTING DEVICES HAVING DIFFERENT STRUCTURES

(71) Applicant: LG ELECTRONICS INC., Seoul (KR)

(72) Inventor: Byungjoon Rhee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/425,587

(22) PCT Filed: Jun. 5, 2013

(86) PCT No.: PCT/KR2013/004965
§ 371 (c)(1),
(2) Date: Mar. 3, 2015

(87) PCT Pub. No.: WO2014/038776
PCT Pub. Date: Mar. 13, 2014

(65) Prior Publication Data
US 2015/0228865 A1    Aug. 13, 2015

(30) Foreign Application Priority Data

Sep. 4, 2012    (KR) ........................ 10-2012-0097614

(51) Int. Cl.
*H01L 27/15* (2006.01)
*H01L 33/00* (2010.01)
(Continued)

(52) U.S. Cl.
CPC .............. *H01L 33/50* (2013.01); *H01L 24/01* (2013.01); *H01L 25/0753* (2013.01);
(Continued)

(58) Field of Classification Search
CPC ....... H01L 33/50; H01L 27/156; H01L 24/01; H01L 2924/12044
See application file for complete search history.

(56) References Cited

U.S. PATENT DOCUMENTS 7,973,319 B2 *  7/2011  Kashiwabara ...... H01L 27/3211
                                                     257/40
2005/0141242 A1 *  6/2005  Takeuchi ............. G02B 6/0021
                                                     362/600
(Continued)

FOREIGN PATENT DOCUMENTS

EP    1 742 514 A1    1/2007
JP    11-260560 A     9/1999
(Continued)

OTHER PUBLICATIONS

Translation of KR 100784015 B1—downloaded May 23, 2016.*
(Continued)

*Primary Examiner* — Thomas L Dickey
*Assistant Examiner* — Damon Hillman
(74) *Attorney, Agent, or Firm* — Birch, Stewart, Kolasch & Birch, LLP (57) ABSTRACT

A display device using semiconductor light emitting devices is disclosed. The display device includes a substrate, a plurality of first electrodes disposed on the substrate, a light emitting device array comprising a plurality of semiconductor light emitting devices electrically connected to the first electrodes, constituting individual pixels, and having different brightnesses increasing from one side of a current input direction of each of the first electrodes to the other side of the current input direction, and a plurality of second electrodes electrically connected to the semiconductor light emitting devices. Thus, brightness variation caused by power loss may be reduced in a display device of PM type
(Continued)

using light emitting device array, thereby reducing load effect that is a problem of the device of PM type using light emitting device array.

20 Claims, 7 Drawing Sheets (51) Int. Cl.
H01L 33/50 (2010.01)
H05B 33/14 (2006.01)
H01L 25/075 (2006.01)
H01L 23/00 (2006.01)
H01L 33/32 (2010.01)
H01L 33/38 (2010.01)
G09G 3/32 (2016.01)

(52) U.S. Cl.
CPC ........ H01L 27/156 (2013.01); H01L 33/0025 (2013.01); H01L 33/32 (2013.01); H01L 33/38 (2013.01); H05B 33/14 (2013.01); G09G 3/32 (2013.01); *H01L 2251/558* (2013.01); *H01L 2924/0002* (2013.01); *H01L 2924/12041* (2013.01); *H01L 2924/12042* (2013.01); *H01L 2924/12044* (2013.01)

(56) References Cited

U.S. PATENT DOCUMENTS

| | | | |
|---|---|---|---|
| 2005/0230692 A1* | 10/2005 | Kim | H01L 25/167 257/79 |
| 2006/0152150 A1 | 7/2006 | Boerner et al. | |
| 2006/0261841 A1* | 11/2006 | Fish | G09G 3/006 345/212 |
| 2006/0284533 A1 | 12/2006 | Lee | |
| 2009/0051275 A1* | 2/2009 | Kobayashi | H01L 51/5265 313/504 |
| 2009/0236620 A1 | 9/2009 | Park et al. | |
| 2010/0213491 A1* | 8/2010 | Lu | H01L 33/504 257/98 |
| 2010/0289735 A1 | 11/2010 | Hosogi et al. | |
| 2011/0012147 A1* | 1/2011 | Bierhuizen | G03B 15/05 257/98 |
| 2013/0299804 A1 | 11/2013 | Ogata et al. | |

FOREIGN PATENT DOCUMENTS

| | | | |
|---|---|---|---|
| JP | 2010-267481 A | | 11/2010 |
| JP | 2011-216668 A | | 10/2011 |
| KR | 10-2004-0060337 A | | 7/2004 |
| KR | 10-2005-0072424 A | | 7/2005 |
| KR | 20060091666 | * | 8/2006 |
| KR | 10-0784015 | * | 10/2006 |
| KR | 10-2007-0056788 A | | 6/2007 |
| KR | 10-0773939 | * | 11/2007 |
| KR | 10-0773939 B1 | | 11/2007 |
| KR | 100773939 B1 | * | 11/2007 |
| KR | 10-0784015 | * | 12/2007 |
| KR | 10-784015 B1 | | 12/2007 |
| KR | 100784015 B1 | * | 12/2007 |
| KR | 10-2009-0098411 A | | 9/2009 |
| KR | 10-2010-0069337 A | | 6/2010 |
| WO | WO 2012/032661 A1 | | 3/2012 |
| WO | WO 2012/091018 A1 | | 7/2012 |

OTHER PUBLICATIONS

Translation of KR 100773939 B1—downloaded May 23, 2016.*
Translation of KR 10-0784015 downloaded Nov. 7, 2016.*
Hosokawa et al., "4.1: Invited Paper: Full-Color Organic EL Display", SID International Symposium, 1998, (May 17-22, 1998), XP-7008540, 4 pages.

* cited by examiner

DISPLAY DEVICE USING SEMICONDUCTOR LIGHT EMITTING DEVICES HAVING DIFFERENT STRUCTURES

TECHNICAL FIELD

The present invention relates to a display device, and more particularly, to a display device using nitride semiconductor light emitting devices.

BACKGROUND ART

Light emitting diodes (LEDs) are well-known semiconductor light emitting devices that convert electric current into light and have been used as light sources for displaying images of electronic equipment including information communication equipment, in conjunction with green GaP:N LEDs, since red LEDs using GaAsP semiconductors were commercialized in 1962.

Nitride compound semiconductors such as gallium nitride (GaN) have high thermal stability and a broad band gap ranging from 0.8 to 6.2 eV, and therefore have received a great deal of attention in fields for the development of high-power output electronic component devices including LEDs.

One of the reasons why gallium nitride (GaN) has attracted a great deal of interest is because it is possible to fabricate semiconductor layers emitting green, blue, and white light, by using GaN in combination with other elements such as indium (In), aluminum (Al), and the like.

Due to the capability to control an emission wavelength via the use of GaN, the emission wavelength may be adjusted to a desired range suited to intrinsic properties of the materials used in compliance with the characteristics of specific equipment. For example, the use of GaN makes it possible to manufacture blue LEDs which are beneficial for optical recording and white LEDs which are capable of replacing incandescent lamps.

Thus, nitride semiconductors are widely used as base materials in manufacture of blue/green laser diodes and light emitting diodes (LEDs).

Meanwhile, conventionally, liquid crystal display (LCD) devices and active matrix organic light emitting diode (AMOLED) display devices are widely used as flat panel display devices.

OLED display devices are generally classified into active matrix (AM) type OLED display devices and passive matrix (PM) type OLED display devices according to driving method. Particularly, differently from AM OLED display devices, PM OLED display devices are current-driven devices and are very sensitive to power loss of electrodes.

It is substantially difficult to implement PM display devices due to electric power loss and changes of properties of organic materials.

That is, although PM display devices have advantages such as a simple manufacturing process and low manufacturing costs, AM display devices are more commonly used due to lower brightness of the PM display devices compared to thin film transistors (TFTs). Furthermore, it is difficult to commercialize PM OLED display devices due to such high sensitivity to electric power loss.

DISCLOSURE

Technical Problem

An object of the present invention devised to solve the problem lies in a display device using semiconductor light emitting devices.

Technical Solution

In another aspect of the present invention, provided herein is a display device using a semiconductor light emitting device including a substrate, a plurality of first electrodes disposed on the substrate, a light emitting device array including a plurality of semiconductor light emitting devices electrically connected to the first electrodes, constituting individual pixels, and having different brightnesses increasing from one side of a current input direction of each of the first electrodes to the other side of the current input direction, a plurality of second electrodes electrically connected to the semiconductor light emitting devices, and a wavelength converting layer disposed on the semiconductor light emitting devices.

The first electrodes and the second electrodes may be aligned to be perpendicular to each other, respectively.

A brightness of at least some of the semiconductor light emitting devices may linearly increase from one side of the current input direction of each of the first electrode to the other side of the current input direction.

A difference between a brightness of a first semiconductor light emitting device from the current input direction of each of the first electrodes and a brightness of a second semiconductor light emitting device from the current input direction may be greater than a linearly increased value.

Each of the semiconductor light emitting devices may include an n-type semiconductor layer, an active layer disposed on the n-type semiconductor layer, a p-type semiconductor layer disposed on the active layer, a p-type electrode disposed on the p-type semiconductor layer, and an n-type electrode disposed on the exposed surface of the n-type semiconductor layer.

A distance between the n-type electrode and the p-type semiconductor layer of each of the semiconductor light emitting devices may decrease from one side of a current input direction of each of the first electrodes to the other side of the current input direction.

The distance between the n-type electrode and the p-type semiconductor layer of some of the semiconductor light emitting devices may linearly decrease from one side of the current input direction of each of the first electrodes to the other side of the current input direction.

A difference between the distance between the n-type electrode and the p-type semiconductor layer of a first semiconductor light emitting device from the current input direction of the first electrode and the distance between the n-type electrode and the p-type semiconductor layer of a second semiconductor light emitting device from the current input direction of the first electrode may be greater than a linearly decreased value.

The p-type semiconductor layers of the semiconductor light emitting devices may have the same length.

In another aspect of the present invention, provided herein is a display device using a semiconductor light emitting device including a substrate, a plurality of first electrodes disposed on the substrate, a light emitting device array including a plurality of semiconductor light emitting devices electrically connected to the first electrodes and constituting individual pixels, a plurality of second electrodes electrically connected to the semiconductor light emitting devices, and a wavelength converting layer disposed on the semiconductor light emitting devices.

The second electrodes and the semiconductor light emitting devices are electrically connected to each other via connection electrodes protruding from the second electrodes, and a thickness or width of each of the connection electrodes increases from one side of a current input direction of each of the first electrodes to the other side of the current input direction, or a length of each of the connection electrodes decreases from one side of the current input direction of the first electrode to the other side of the current input direction The semiconductor light emitting devices are aligned in plural rows, and the second electrodes are disposed between the rows of the semiconductor light emitting devices.

A thickness or width of each of the first electrodes may increase from one side of a current input direction of each of the first electrodes to the other side of the current input direction.

The substrate may be a transparent flexible substrate.

The semiconductor light emitting device may be a nitride semiconductor light emitting device.

The semiconductor light emitting device may be a blue light emitting device, and the wavelength converting layer may include a red fluorescent (phosphor) material and a green fluorescent (phosphor) material constituting an individual pixel.

The semiconductor light emitting devices may be blue light emitting devices, and the wavelength converting layer may include a red fluorescent (phosphor) material, a green fluorescent (phosphor) material, and a yellow fluorescent (phosphor) material constituting individual pixels.

The wavelength converting layer may further include a black matrix disposed between the fluorescent (phosphor) materials.

Red, green, and blue sub-pixels may constitute one pixel, or red, green, blue, and white sub-pixels may constitute one pixel.

In another aspect of the present invention, provided herein is a display device using semiconductor light emitting devices including a substrate, a plurality of first electrodes disposed on the substrate, a light emitting device array including a plurality of semiconductor light emitting devices electrically connected to the first electrodes, constituting individual pixels, and having different brightnesses, and a plurality of second electrodes electrically connected to the semiconductor light emitting devices.

In addition, the brightness of each of the semiconductor light emitting devices increases from one side of a current input direction of the first electrode to the other side thereof.

Advantageous Effects

According to the present invention, brightness variation caused by power loss may be reduced in a PM type structure by fabricating semiconductor light emitting devices as sub-pixels and compensating brightness using semiconductor light emitting devices having different brightnesses. Accordingly, load effect that is a problem of the PM type structure may be reduced.

In addition, brightness variation may also be minimized by respectively adjusting line resistances of the semiconductor light emitting devices in a PM type structure.

Furthermore, design of semiconductor chips may be easily adjusted, thereby preventing local luminance unevenness.

It is to be understood that technical advantageous effects to be achieved by the present invention are not limited to the aforementioned technical advantageous effects and other technical advantageous effects which are not mentioned will be apparent from the following description to the person with an ordinary skill in the art to which the present invention pertains.

DESCRIPTION OF DRAWINGS

The accompanying drawings, which are included to provide a further understanding of the invention, illustrate embodiments of the invention and together with the description serve to explain the principle of the invention.

In the drawings.

BEST MODE

Reference will now be made in detail to the preferred embodiments of the present invention, examples of which are illustrated in the accompanying drawings.

It will be apparent to those skilled in the art that various modifications and variations can be made in the present invention without departing from the spirit or scope of the invention. The accompanying drawings are used to provide easy understanding of the technical idea of the present invention and it should be understood that the idea of the present invention is not limited by the accompanying drawings. However, the idea of the present invention should be construed to extend to any alterations, equivalents and substitutions besides the accompanying drawings.

It will be understood that when an element such as a layer, region or substrate is referred to as being "on" another element, it can be directly on the other element or intervening elements may also be present.

It will be understood that, although the terms first, second, etc. may be used herein to describe various elements, components, regions, layers and/or sections, these elements, components, regions, layers and/or sections should not be limited by these terms.

First Embodiment

Figure 1:
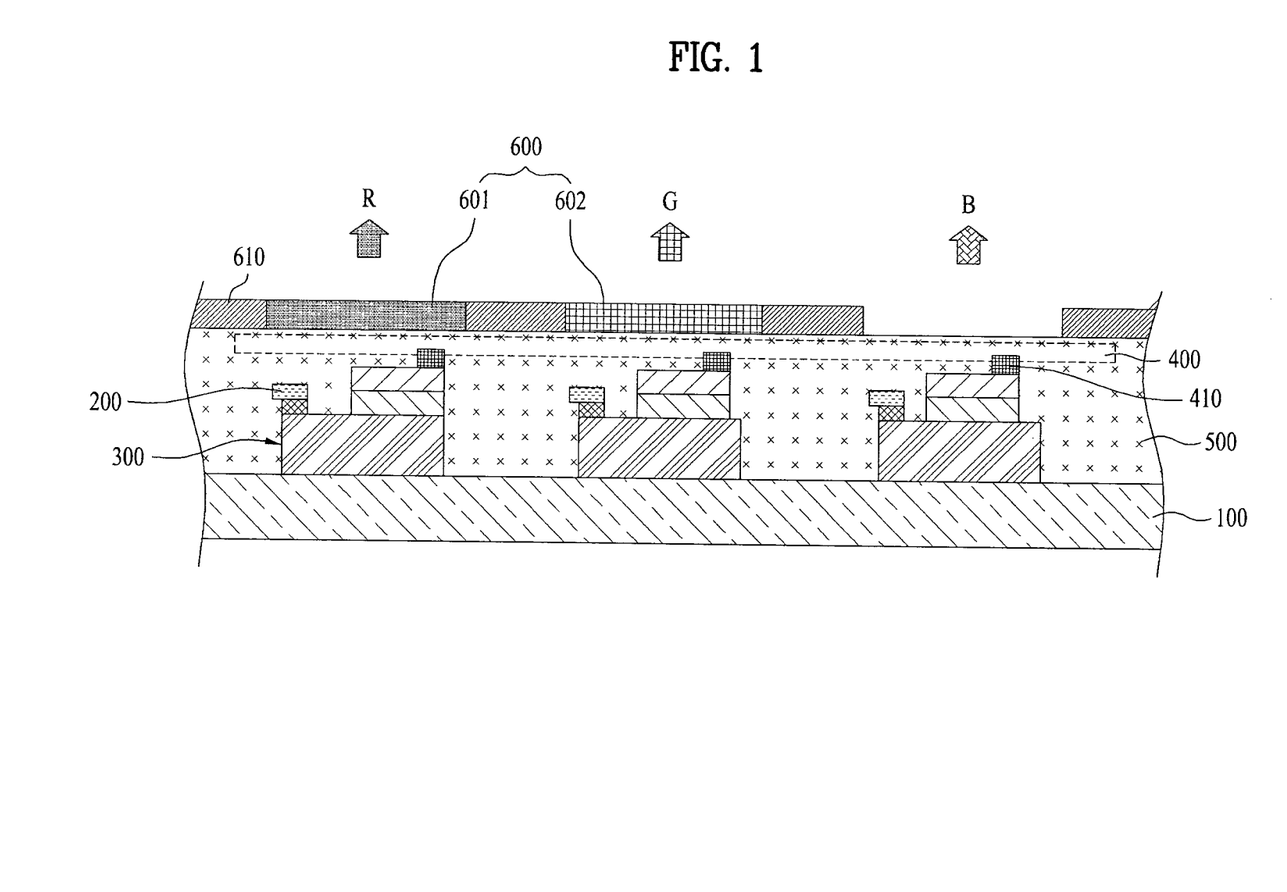
FIG. 1 is a cross-sectional view illustrating a display device using semiconductor light emitting devices according to a first embodiment.

FIG. 1 is a cross-sectional view illustrating a display device using semiconductor light emitting devices according to a first embodiment.

Referring to FIG. 1, the display device is a display device of passive matrix (PM) type using semiconductor light emitting devices.

The display device using the semiconductor light emitting devices includes a substrate 100, a plurality of first electrodes 200, a light emitting device array, which includes a plurality of semiconductor light emitting devices 300, a plurality of second electrodes 400, and a wavelength converting layer 600.

The substrate 100 may be a circuit board on which the first electrodes 200 are aligned. The substrate 100 may also be a flexible substrate.

Thus, the substrate 100 may include glass or polyimide (PI) in order to implement a flexible display device. However, any suitable insulating and flexible material may also be used.

The first electrodes 200 are disposed on the substrate 100. If required, the first electrodes 200 may be formed on the substrate 100 directly or spaced apart from the substrate 100.

In addition, a plurality of the first electrodes 200 may be aligned on the substrate 100 at equal intervals. The first electrodes 200 may be bar-shaped electrodes. The first electrodes 200 may function as scanning or data electrodes in a PM structure.

The light emitting device array includes a plurality of semiconductor light emitting devices 300 having different brightnesses. These semiconductor light emitting devices 300 respectively constitute individual pixels and are electrically connected to the first electrodes 200.

For example, a plurality of first electrodes 200 may be disposed, and the semiconductor light emitting devices 300 may be aligned in plural rows. Here, the semiconductor light emitting devices 300 in the same row may be electrically connected to one of the first electrodes 200.

In addition, such semiconductor light emitting devices 300 may be, for example, nitride semiconductor light emitting devices. Due to excellent brightness, the semiconductor light emitting devices 300, which are small in size, may form individual sub-pixels.

In this regard, each of the semiconductor light emitting devices 300 may have a brightness increasing from one side of a current input direction of each of the first electrodes 200 to the other side thereof. As a result, brightness variation in accordance with power loss caused in the semiconductor light emitting devices 300 connected to the same first electrode 200 may be minimized.

In addition, the brightness of at least some of the semiconductor light emitting devices 300 may be linearly increased from one side of the current input direction of the first electrode 200 to the other side thereof.

Here, the first electrode 200 may have a resistance linearly increasing with respect to the semiconductor light emitting devices 300 from one side of the current input direction of the first electrode 200 to the other side thereof.

Accordingly, brightness variation may be minimized by linearly increasing brightnesses of the semiconductor light emitting devices 300 correspondingly.

Preferably, brightness difference between a first semiconductor light emitting device 300 and a second semiconductor light emitting device 300 from the one side of the current input direction of the first electrode 200 may be set to be greater than a linearly increased value.

Since the first semiconductor light emitting device 300 from the one side of the first electrode 200 into which current is input has a lower line resistance, a semiconductor chip having a lower brightness may be used for the first semiconductor light emitting device 300.

Meanwhile, brightness variation may be minimized by adjusting a thickness or width of the first electrode 200 in addition to using semiconductor light emitting devices 300 having different brightnesses.

For example, in addition to adjusting the brightnesses of the semiconductor light emitting devices 300, the thickness or width of the first electrode 200 may be increased from one side of the current input direction of the first electrode 200 to the other side thereof, so that brightnesses of the semiconductor light emitting devices 300 may be uniformly compensated.

The second electrodes 400 are electrically connected to the semiconductor light emitting devices 300, which are electrically connected to the first electrodes 200. The second electrodes 400 may function as scanning or data electrodes in a PM structure.

The second electrodes 400 may be disposed on the semiconductor light emitting devices 300 or between the semiconductor light emitting devices 300.

This is because the semiconductor light emitting devices 300, which are small in size, may form individual sub-pixels.

Accordingly, a distance between the semiconductor light emitting devices 300 is relatively long enough to allow each of the second electrodes 400 to be disposed between the semiconductor light emitting devices 300. Furthermore, a flexible display device may be implemented.

Meanwhile, the first electrodes 200 and the second electrodes 400 may be aligned to be perpendicular to each other. That is, a display device of PM type using semiconductor light emitting devices may be implemented.

A barrier wall 500 may further be disposed between the semiconductor light emitting devices 300 in order to isolate each of the semiconductor light emitting devices 300 which constitute individual pixels.

In this regard, the barrier walls 500 may isolate individual sub-pixels from each other, and a reflective barrier wall may be used as the barrier wall 500.

In addition, the barrier wall 500 may include a black or white insulating material in accordance with function of the display device.

When a barrier wall 500 including a white insulating material is used, reflectivity may be improved. When a barrier wall 500 including a black insulating material is used, a contrast ratio may be improved while having reflectivity.

The wavelength converting layer 600 is disposed on the semiconductor light emitting device 300. For example, when the semiconductor light emitting devices 300 are blue semiconductor light emitting devices emitting blue (B) light, the wavelength converting layer 600 converting blue (B) into a color of an individual sub-pixel may be disposed.

In this regard, the wavelength converting layer 600 may include a red fluorescent (phosphor) material 601 and a green fluorescent (phosphor) material 602 constituting the individual sub-pixels.

That is, a red fluorescent (phosphor) material 701, which converts blue (B) light into red (R) light, may be disposed on the blue semiconductor light emitting device 300 in one sub-pixel.

In addition, a green fluorescent (phosphor) material 702, which converts blue (B) light into green (G) light, may be disposed on the blue semiconductor light emitting device 300 in another sub-pixel. In addition, in a blue sub-pixel, the blue semiconductor light emitting device may be disposed alone.

Thus, a full color display device, in which red (R), green (G), and blue (B) sub-pixels constitute one pixel, may be designed by applying the red and green fluorescent (phosphor) materials to the blue semiconductor light emitting devices 300.

In addition, a full color display device, in which red (R), green (G), blue (B), and white (W) sub-pixels constitute one pixel, may be designed by applying a red fluorescent (phosphor) material 701, a green fluorescent (phosphor) material 702, and a yellow fluorescent (phosphor) material (not shown) to the blue semiconductor light emitting devices 300.

In this case, power may be reduced by maximizing efficiencies of the blue semiconductor light emitting devices 300 and the yellow fluorescent (phosphor) material for realizing full white color.

Here, in order to increase contrast ratio, a black matrix 610 may be disposed between the fluorescent (phosphor) materials. That is, the black matrix 610 may improve contrast.

Meanwhile, as occasion demands, the semiconductor light emitting devices 300 may include white light emitting devices respectively including a yellow wavelength converting layer.

In this case, the sub-pixels may respectively include the red fluorescent (phosphor) material, the green fluorescent (phosphor) material, and the blue fluorescent (phosphor) material. In addition, the pixels may include a color filter, in which red, green, and blue are repeated, disposed on the white light emitting devices instead of the wavelength converting layers.

Meanwhile, when the semiconductor light emitting devices 300 are red, green, and blue semiconductor light emitting devices to respectively form sub-pixels, the wavelength converting layer may be omitted.

In this case, the red, green, and blue semiconductor light emitting devices are sequentially aligned. Accordingly, a full color display device in which three color sub-pixels constitute one pixel using the red, green, and blue semiconductor light emitting devices may be designed.

Meanwhile, as a method of controlling brightnesses of the semiconductor light emitting devices 300, a method of controlling internal resistances of the semiconductor light emitting devices 300 is used.

Hereinafter, a method of controlling an internal resistance of each of the semiconductor light emitting devices 300 will be described in more detail.

Figure 2:
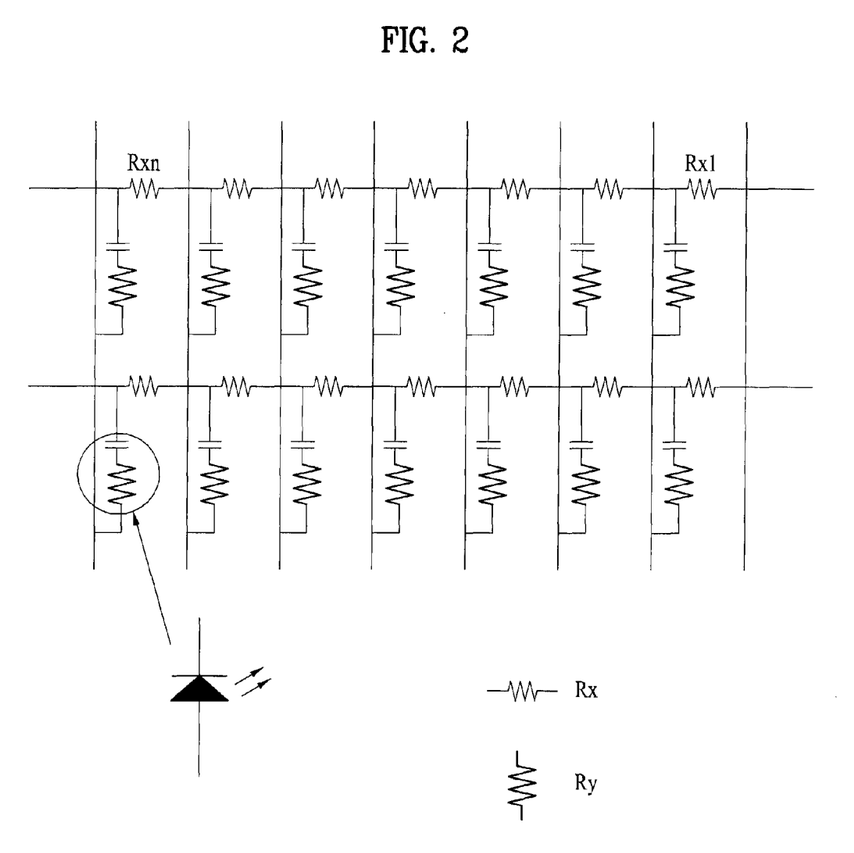
FIG. 2 is an equivalent circuit diagram of a passive matrix (PM) type light emitting device array.

FIG. 2 is an equivalent circuit diagram of a passive matrix (PM) type light emitting device array.

Referring to FIG. 2, an electrode line has a resistance ($R_x$), and each of the semiconductor light emitting devices 300 has a resistance ($R_y$).

That is, the resistance with respect to each of the semiconductor light emitting devices 300 is a sum resistance of the line resistance ($R_x$) and the internal resistance ($R_y$) of each of the semiconductor light emitting devices 300.

Thus, the brightness of each of the semiconductor light emitting devices 300 may be adjusted by controlling the internal resistance ($R_y$) of each of the semiconductor light emitting devices 300.

Figure 3:
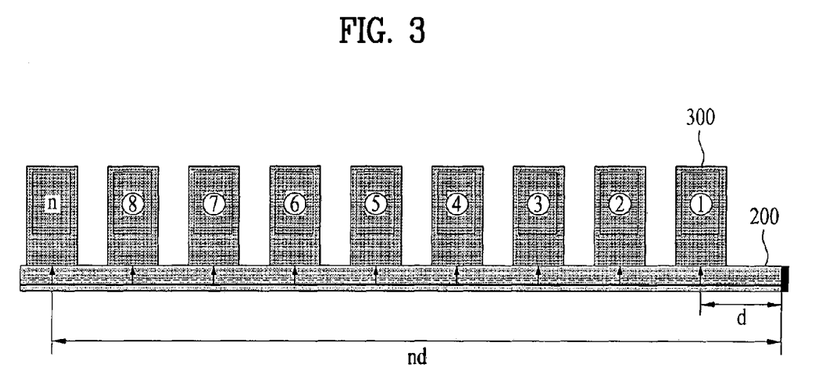
FIG. 3 is a diagram for describing a resistance generated in a lengthwise direction of an electrode with respect to semiconductor light emitting devices.

FIG. 3 is a diagram for describing a resistance generated in a lengthwise direction of the first electrode 200 with respect to the semiconductor light emitting devices 300. For convenience of description, a light emitting device array including a first electrode 200 and a plurality of semiconductor light emitting devices 300 connected to the first electrode 200 is illustrated.

Referring to FIG. 3, n semiconductor light emitting devices 300 are aligned in a row, and the first electrode 200 is electrically connected to the semiconductor light emitting devices 300. In this regard, when current is input to the first electrode 200, resistance is generated in the lengthwise direction of the first electrode 200.

In more detail, a line resistance ($R_{x1}$) with respect to a first semiconductor light emitting device is $\rho \times d/A$. In this regard, $\rho$ is a resistivity of a material for forming the first electrode 200, d is a distance between the one end of the first electrode 200 and each of the semiconductor light emitting devices 300, and A is the product of the thickness (t) and width (W) of the first electrode 200. In addition, the line resistance ($R_{xn}$) of the $n^{th}$ semiconductor light emitting device is $\rho \times nd/A$.

Accordingly, when the input current is I, the $n^{th}$ semiconductor light emitting device has a resistance n times greater than that of the first semiconductor light emitting device, thereby causing a voltage drop. Thus, the total resistance of the semiconductor light emitting devices 300 is not uniformly maintained due to power loss, thereby causing brightness variation.

Figure 4:
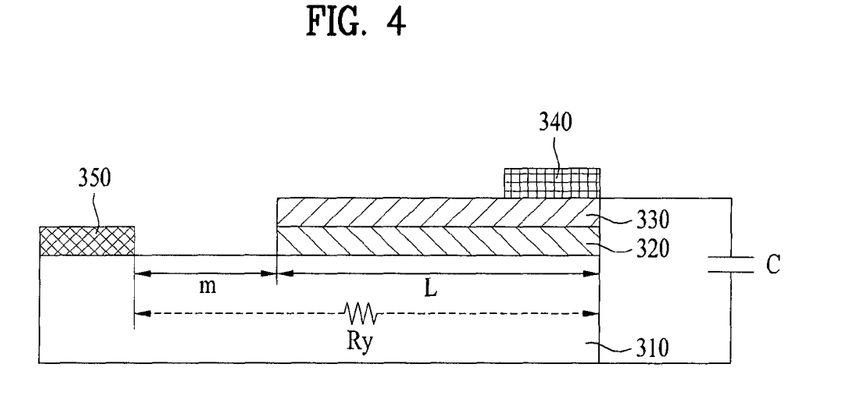
FIG. 4 is a cross-sectional view illustrating internal resistance of a semiconductor light emitting device.

FIG. 4 is a cross-sectional view illustrating internal resistance of a semiconductor light emitting device.

Referring to FIG. 4, the semiconductor light emitting device 300 includes an n-type semiconductor layer 310 disposed on a transparent dielectric substrate (not shown), an active layer 320 disposed on the n-type semiconductor layer 310, a p-type semiconductor layer 330 disposed on the active layer 320, a p-type electrode 340 disposed on the p-type semiconductor layer 330, and an n-type electrode 350 disposed on an exposed portion of the surface of the n-type semiconductor layer 310.

Accordingly, the n-type electrode 350 may be electrically connected to the first electrode 200, and the p-type electrode 340 may be electrically connected to the second electrode 400.

The semiconductor light emitting device has a horizontal structure. In a horizontal structure, anisotropic electric fields are formed, and thus vertical and horizontal fields need to be considered.

As a horizontal distance between the n-type electrode 350 and the p-type electrode 340 increases, a path of electrons extends. Thus, the resistance ($R_y$) relatively increases and may be a factor causing power loss.

In this regard, the horizontal distance between the n-type electrode 350 and the p-type electrode 340 corresponds to a sum of a distance m between the n-type electrode 350 and the p-type semiconductor layer 330 and a length L of the p-type semiconductor layer 330.

Thus, the distance m between the n-type electrode 350 and the p-type semiconductor layer 330 is a factor influencing the internal resistances of the semiconductor light emitting devices 300. Thus, semiconductor light emitting devices 300 having different brightnesses may be prepared by increasing or reducing the internal resistances of the semiconductor light emitting devices 300 by adjusting the distance m.

The light emitting device array may be designed to have minimized brightness variation by use of the semiconductor light emitting devices 300 having different brightnesses.

For example, the distance m between the n-type electrode 350 and the p-type semiconductor layer 330 of each of the semiconductor light emitting devices 300 may be reduced from one side of the current input direction of the first electrode 200 to the other side thereof to control the internal resistance of each of the semiconductor light emitting devices 300.

In this regard, since the line resistance of the first electrode 200 linearly increases from one side of the current input direction of the first electrode 200 to the other side thereof, it may be preferable to linearly decrease the distance m between the n-type electrode 350 and the p-type semiconductor layer 330 of at least some of the semiconductor light emitting devices 300 from one side of the current input direction of the first electrode 200 to the other side thereof.

Particularly, a difference between the distance between the n-type electrode 350 and the p-type semiconductor layer 330 of the first semiconductor light emitting device from the current input direction of the first electrode 200 and the distance between the n-type electrode 350 and the p-type semiconductor layer 330 of the second semiconductor light emitting device may be designed to exceed a linearly decreased value.

Meanwhile, since the length L of the p-type semiconductor layer 330 is closely related to a recombination region for electrons and holes, the semiconductor light emitting devices 300 may be designed such that the lengths L of the semiconductor light emitting devices 300 are the same, and the distances m of the semiconductor light emitting devices 300 are changed.

That is, it is preferable to design the sizes of the p-type semiconductor layers 330 of the semiconductor light emitting devices 300 to be the same.

According to a method of manufacturing the semiconductor light emitting device, for example, an active layer 320 and a p-type semiconductor layer 330 are disposed on the n-type semiconductor layer 310

Then, the active layer 320 and the p-type semiconductor layer 330 may be partially etched using a mask designed to form the same length L and different distances m to prepare semiconductor light emitting devices 300 having different brightnesses.

Each of the semiconductor light emitting devices 300 may have a rectangular or square shape having one side of 100 μm or less.

The semiconductor light emitting devices 300 may be driven by current. Due to excellent brightness, the semiconductor light emitting devices 300, which are small in size, may constitute individual sub-pixel.

In addition, when one side of each of the semiconductor light emitting devices 300 is designed to be 100 μm or less, the length of the p-type semiconductor layer 330, which is closely related to the recombination region, need not be reduced.

Thus, the distance between the n-type electrode 350 and the p-type semiconductor layer 330 of each of the semiconductor light emitting devices 300 may be 10 μm or less.

Figure 5:
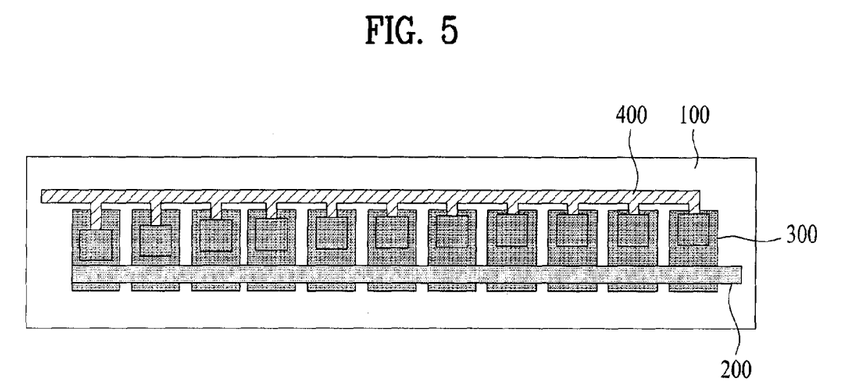
FIG. 5 is a top view illustrating a light emitting device array of a display device according to an embodiment.

FIG. 5 is a top view illustrating a light emitting device array of a display device according to an embodiment.

FIG. 5 illustrates a structure in which the semiconductor light emitting devices 300 aligned in a row are connected to one first electrode 200 and one second electrode 400. However, this structure is illustrated for convenience of description of PM type semiconductor light emitting devices, and the present invention is not limited thereto.

Referring to FIG. 5, the semiconductor light emitting devices 300 having different brightnesses, for example, the semiconductor light emitting devices 300 having different internal resistances are electrically connected to the first electrode 200.

The resistance with respect to each of the semiconductor light emitting devices 300 is a sum resistance of the line resistance of the first electrode 200 and the internal resistance of the semiconductor light emitting device 300.

In addition, the line resistance of the first electrode 200 with respect to each of the semiconductor light emitting devices 300 connected to the first electrode 200 increases from one side of the current input direction of the first electrode 200 to the other side thereof. In other words, power loss occurs.

Thus, the total resistance with respect to the semiconductor light emitting devices 300 may be uniformly controlled by reducing the distance between the n-type electrode and the p-type semiconductor layer 330 of each of the semiconductor light emitting devices 300 from one side of the current input direction of the first electrode 200 to the other side thereof.

Accordingly, power loss of a PM type structure may be compensated. As a result, brightness variation caused by power loss may be minimized.

Meanwhile, the internal resistance of each of the semiconductor light emitting devices 300 may also be controlled by adjusting a thickness of layer or a chip size of each of the semiconductor light emitting devices 300 or a thickness or an area of the n-type electrode or the p-type electrode in addition to controlling the distance between the n-type electrode and the p-type semiconductor layer 330 of each of the semiconductor light emitting devices 300.

Hereinafter, brightness variation of the light emitting device array measured before and after compensation will be described.

Figure 6:
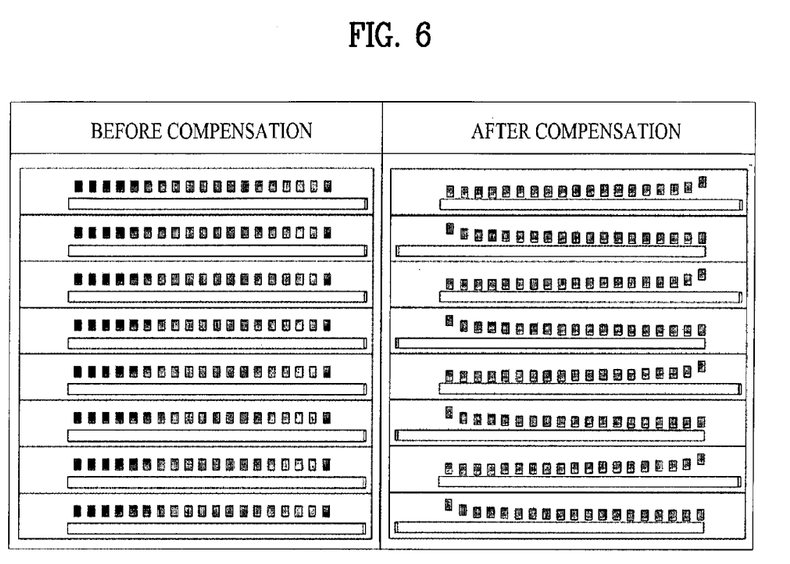
FIG. 6 is a top view illustrating brightness variation before and after compensation of power loss of a light emitting device array.

FIG. 6 is a top view illustrating brightness variation before and after compensation of power loss of a light emitting device array.

Referring to FIG. 6, only first electrodes and luminescent regions of a PM type light emitting device array are illustrated. The luminescent region corresponds to the p-type semiconductor layer of each of the semiconductor light emitting devices. Current is input to one ends of each of the first electrodes 200 indicated as two lines.

The light emitting device array before compensation has a structure in which a plurality of semiconductor light emitting devices having the same brightness is aligned in a row.

In this regard, the semiconductor light emitting device is a horizontal semiconductor light emitting device, and each of the semiconductor light emitting devices has a uniform internal resistance. For example, the distance between the n-type electrode and the p-type semiconductor layer is the same in each of the semiconductor light emitting devices.

The light emitting device array after compensation has a structure in which a plurality of semiconductor light emitting devices having different brightnesses is aligned in a row.

In this case, the internal resistance of each of the semiconductor light emitting devices is designed to decrease from one side of the current input direction of the first electrode to the other side thereof. That is, the distance between the n-type electrode and the p-type semiconductor layer of each of the semiconductor light emitting devices decreases from one side of the current input direction of the first electrode to the other side thereof.

As a result of measuring brightness variation of the light emitting device array before and after compensation, it can be seen that brightness variation of the structure of the light emitting device array after compensation is less than brightness variation of the structure before compensation.

Accordingly, brightness variation of the PM type light emitting device array may be compensated by use of the semiconductor light emitting devices having different brightnesses.

Meanwhile, a display device having minimized brightness variation may be fabricated by use of a light emitting device array having the same structure as described above, except that a plurality of semiconductor light emitting devices having the same brightness is used, and resistances of the semiconductor light emitting devices are adjusted.

For example, the display device includes a substrate, a plurality of first electrodes disposed on the substrate, a light emitting device array including a plurality of semiconductor light emitting devices electrically connected to the first electrodes and constituting individual pixels, a plurality of second electrodes electrically connected to the semiconductor light emitting devices, and a wavelength converting layer disposed on the semiconductor light emitting devices.

In addition, the second electrodes may be electrically connected to the semiconductor light emitting devices via connection electrodes protruding from the second electrodes.

Then, a thickness or width of each of the connection electrodes may increase from one side of the current input direction of each the first electrodes to the other side thereof, or a length of each of the connection electrodes may decrease from one side of the current input direction of each the first electrodes to the other side thereof.

Alternatively, when a plurality of semiconductor light emitting devices is connected to the same first electrode, a thickness or width of the first electrode may be designed to increase from one side of the current input direction of each the first electrodes to the other side thereof.

Thus, the display device may emit light having uniform brightness by varying line resistance of the first electrode with respect to the semiconductor light emitting devices.

Second Embodiment

Figure 7:
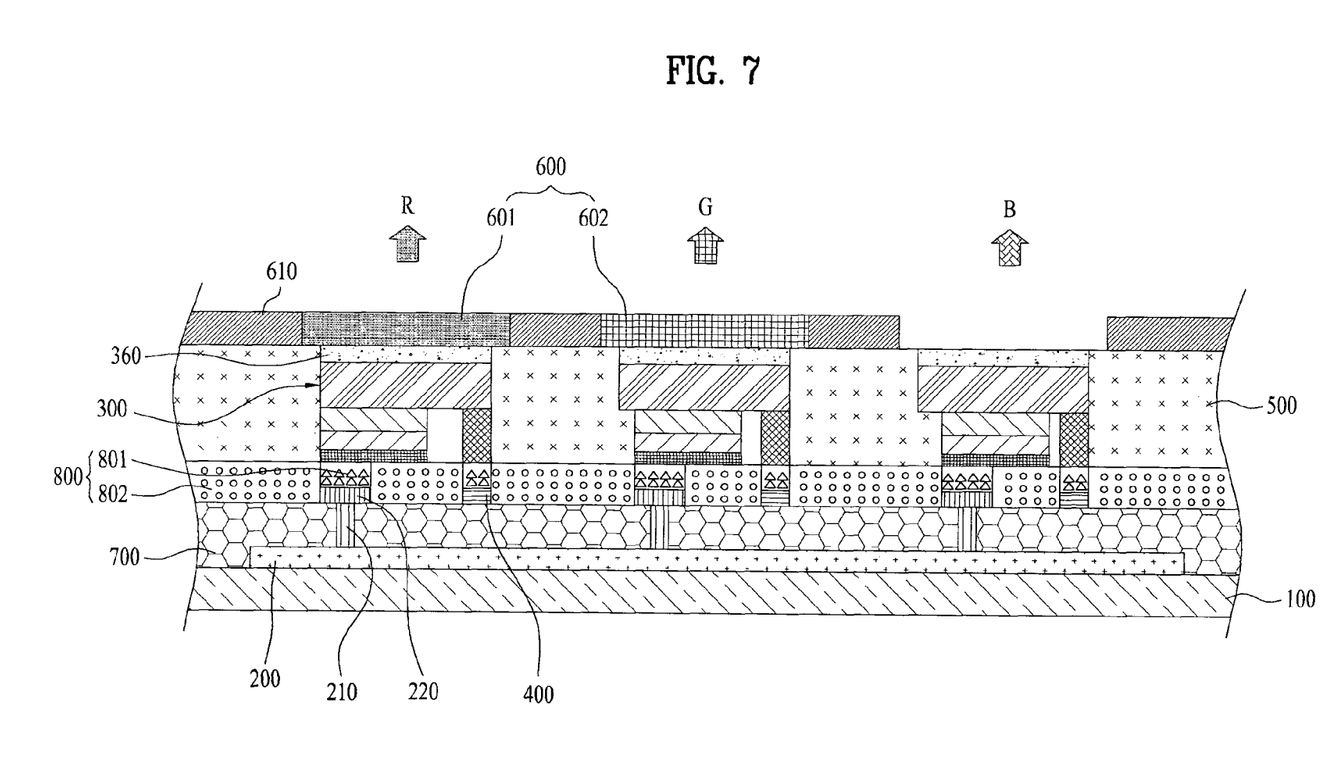
FIG. 7 is a cross-sectional view partially illustrating a display device using semiconductor light emitting devices according to a second embodiment.

FIG. 7 is a cross-sectional view partially illustrating a display device using semiconductor light emitting devices according to a second embodiment.

Referring to FIG. 7, the display device using semiconductor light emitting devices is a display device of PM type using semiconductor light emitting devices.

In addition, the semiconductor light emitting device is a flip chip type light emitting device.

The display device using the semiconductor light emitting devices includes a substrate 100, a plurality of first electrodes 200, an interlayer insulating layer 700, an anisotropic conductive film 800, a plurality of second electrodes 400, a light emitting device array including a plurality of semiconductor light emitting devices 300, and a wavelength converting layer 600.

The substrate 100 may be a flexible substrate. In addition, the substrate 100 may be formed of a transparent material.

The first electrodes 200 are disposed on the substrate 100. In addition, the interlayer insulating film 700 is disposed on the substrate 100 provided with the first electrodes 200.

Auxiliary electrodes 220 are electrodes electrically connecting each of the first electrodes 200 with each of the semiconductor light emitting devices 300, disposed on the interlayer insulating film 700, and aligned to correspond to the first electrodes 200.

For example, the auxiliary electrodes 220 may be formed in dot shapes. In this regard, the auxiliary electrodes 220 may be electrically connected to the first electrodes 200 via through-hole electrodes 210 that penetrate the interlayer insulating film 700.

The second electrodes 400 are disposed on the interlayer insulating film 700 to be spaced apart from the auxiliary electrodes 220.

The anisotropic conductive film 800 is disposed on the interlayer insulating film 700 on which the auxiliary electrodes 220 and the second electrodes 400 are disposed.

An anisotropic conductive film (ACF) is formed of a plurality of particles in which conductive cores are respectively coated with an insulating film.

When pressure or heat is applied to the anisotropic conductive film, the insulating film is destroyed at regions to which the pressure or heat is applied, such that the regions of the anisotropic conductive film are electrically connected to a layer via exposed cores of the anisotropic conductive film. In this case, the cores may be deformed to be connected to the layer.

For example, after the anisotropic conductive film 800 is disposed on the interlayer insulating film 700 provided with the auxiliary electrodes 220 and the second electrodes 400, the semiconductor light emitting devices 300 are connected thereto in a flip chip form by applying heat or pressure thereto.

In this case, the anisotropic conductive film 800 becomes conductive at conductive regions 801 between the p-type electrodes of the semiconductor light emitting devices 300 and the auxiliary electrodes 220 and between the n-type electrodes of the semiconductor light emitting device 300 and the second electrodes 400 to which heat or pressure is applied.

In addition, the anisotropic conductive film 800 is not conductive at non-conductive regions 802 to which heat or pressure is not applied.

Thus, the anisotropic conductive film 800 may not only bond the semiconductor light emitting device 300 to the auxiliary electrode 220 but also electrically connect the semiconductor light emitting device 300 with the second electrode 400

The light emitting device array includes a plurality of semiconductor light emitting devices 300 having different brightnesses. These semiconductor light emitting devices 300 constitute individual pixels and are electrically connected to the first electrodes 200.

For example, a plurality of first electrodes 200 may be disposed, and the semiconductor light emitting devices 300 may be aligned in plural rows. Here, the semiconductor light emitting devices 300 in the same row may be electrically connected to one of the first electrodes 200.

In addition, since the semiconductor light emitting devices 300 are connected in a flip chip form, the semiconductor light emitting devices 300 grown on a transparent dielectric substrate 360 may be used.

In addition, the semiconductor light emitting devices 300 may be nitride semiconductor light emitting devices. Due to excellent brightness, the semiconductor light emitting devices 300, which are small in size, may constitute individual sub-pixels.

A barrier wall 500 may be disposed between the semiconductor light emitting devices 300.

The wavelength converting layer 600 is disposed on the semiconductor light emitting devices 300. For example, the semiconductor light emitting devices 300 are blue semiconductor light emitting devices emitting blue (B) light, and the wavelength converting layer 600 converting blue (B) into a color of an individual sub-pixel may be disposed. In this regard, the wavelength converting layer 600 may include a red fluorescent (phosphor) material 601 and a green fluorescent (phosphor) material 602 constituting individual sub-pixels.

In this regard, the black matrix 610 may be disposed between the fluorescent (phosphor) materials in order to increase contrast ratio. That is, the black matrix 610 may improve contrast.

Thus, a full color display in which the red (R), green (G), and blue (B) sub-pixels constitute one pixel may be designed by applying the red and green fluorescent (phosphor) materials to the blue semiconductor light emitting devices 300.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. A display device using a semiconductor light emitting device comprising:
   a substrate;
   a plurality of first electrodes disposed on the substrate;
   a light emitting device array comprising a plurality of semiconductor light emitting devices electrically connected to the first electrodes, constituting individual pixels, and having different brightnesses increasing from one side of a current input direction of each of the first electrodes to the other side of the current input direction, wherein the semiconductor light emitting devices comprise a semiconductor structure including an active layer, a p-type electrode disposed on a surface of the semiconductor structure and an n-type electrode disposed on another surface of the semiconductor structure;
   a plurality of second electrodes electrically connected to the semiconductor light emitting devices; and
   a wavelength converting layer disposed on the semiconductor light emitting devices,
   wherein a distance between the n-type electrode and the p-type electrode of one of the semiconductor light emitting devices is different from a distance between the n-type electrode and the p-type electrode of another semiconductor light emitting device, and
   wherein a distance between the n-type electrode and the p-type electrode of the semiconductor light emitting devices decreases from one side of a current input direction of each of the first electrodes to the other side of the current input direction.

2. The display device according to claim 1, wherein the first electrodes and the second electrodes are aligned to be perpendicular to each other, respectively.

3. The display device according to claim 1, wherein a brightness of at least some of the semiconductor light emitting devices linearly increases from one side of the current input direction of each of the first electrode to the other side of the current input direction.

4. The display device according to claim 3, wherein a difference between a brightness of a first semiconductor light emitting device from the current input direction of each of the first electrodes and a brightness of a second semiconductor light emitting device from the current input direction is greater than a linearly increased value.

5. The display device according to claim 1, wherein the semiconductor structure comprises:

an n-type semiconductor layer electrically connected to the n-type electrode;
the active layer disposed on the n-type semiconductor layer; and
a p-type semiconductor layer disposed on the active layer electrically connected to the p-type electrode.

6. The display device according to claim 5, wherein a distance between the n-type electrode and the p-type semiconductor layer of each of the semiconductor light emitting devices decreases from one side of a current input direction of each of the first electrodes to the other side of the current input direction.

7. The display device according to claim 6, wherein the distance between the n-type electrode and the p-type semiconductor layer of some of the semiconductor light emitting devices linearly decreases from one side of the current input direction of each of the first electrodes to the other side of the current input direction.

8. The display device according to claim 7, wherein a difference between the distance between the n-type electrode and the p-type semiconductor layer of a first semiconductor light emitting device from the current input direction of the first electrode and the distance between the n-type electrode and the p-type semiconductor layer of a second semiconductor light emitting device from the current input direction of the first electrode is greater than a linearly decreased value.

9. The display device according to claim 8, wherein the p-type semiconductor layers of the semiconductor light emitting devices have the same length.

10. The display device according to claim 1, wherein the substrate is a transparent flexible substrate.

11. The display device according to claim 1, wherein:
the semiconductor light emitting devices are blue light emitting devices; and
the wavelength converting layer is a yellow wavelength converting layer.

12. The display device according to claim 11, further comprising a color filter comprising red, green, and blue color filters repeatedly aligned and disposed on the yellow wavelength converting layer.

13. The display device according to claim 1, wherein:
the semiconductor light emitting devices are blue light emitting devices; and
the wavelength converting layer comprises a red fluorescent (phosphor) material, a green fluorescent (phosphor) material, and a yellow fluorescent (phosphor) material constituting individual pixels.

14. The display device according to claim 1, wherein the wavelength converting layer further comprises a black matrix disposed between the fluorescent (phosphor) materials.

15. The display device according to claim 1, wherein red, green, and blue sub-pixels constitute one pixel, or red, green, blue, and white sub-pixels constitute one pixel.

16. A display device using a semiconductor light emitting device comprising:
   a substrate;
   a plurality of first electrodes disposed on the substrate;
   a light emitting device array comprising a plurality of semiconductor light emitting devices electrically connected to the first electrodes and constituting individual pixels;
   a plurality of second electrodes electrically connected to the semiconductor light emitting devices; and
   a wavelength converting layer disposed on the semiconductor light emitting devices, wherein the second electrodes and the semiconductor light emitting devices are electrically connected to each other via connection electrodes protruding from the second electrodes, wherein a length of one of the connection electrodes is different from a length of another connection electrode, and wherein a length of the connection electrodes decreases from one side of the current input direction of the first electrode to the other side of the current input direction.

17. The display device according to claim 16, wherein:

the semiconductor light emitting devices are aligned in plural rows; and the second electrodes are disposed between the rows of the semiconductor light emitting devices.

18. The display device according to claim 16, wherein:

a thickness or width of each of the first electrodes increases from one side of a current input direction of each of the first electrodes to the other side of the current input direction.

19. The display device according to claim 16, wherein:

the semiconductor light emitting devices are blue light emitting devices; and the wavelength converting layer is a yellow wavelength converting layer.

20. The display device according to claim 19, further comprising a color filter comprising red, green, and blue color filters repeatedly aligned and disposed on the yellow wavelength converting layer.

* * * * *